(12) United States Patent
Mizokuchi et al.

(10) Patent No.: US 7,709,888 B2
(45) Date of Patent: May 4, 2010

(54) SEMICONDUCTOR DEVICE

(75) Inventors: Shuji Mizokuchi, Niigata (JP); Kazuaki Tsunoda, Tokyo (JP)

(73) Assignee: Panasonic Corporation, Osaka (JP)

( * ) Notice: Subject to any disclaimer, the term of this patent is extended or adjusted under 35 U.S.C. 154(b) by 427 days.

(21) Appl. No.: 11/664,096

(22) PCT Filed: Sep. 29, 2005

(86) PCT No.: PCT/JP2005/017963

§ 371 (c)(1),
(2), (4) Date: Mar. 29, 2007

(87) PCT Pub. No.: WO2006/035877

PCT Pub. Date: Apr. 6, 2006

(65) Prior Publication Data

US 2008/0211017 A1    Sep. 4, 2008

(30) Foreign Application Priority Data

Sep. 29, 2004   (JP)   ............................. 2004-283888

(51) Int. Cl.
*H01L 29/78*    (2006.01)
(52) U.S. Cl. ............... 257/330; 257/331; 257/E29.262; 257/E21.41; 438/270

(58) Field of Classification Search .......... 257/E29.262, 257/E21.41, 330, 331; 438/270
See application file for complete search history.

(56) References Cited

U.S. PATENT DOCUMENTS

| 2003/0178673 A1* | 9/2003 | Bhalla et al. | ................. 257/330 |
| 2004/0166656 A1* | 8/2004 | Numazawa et al. | ......... 438/589 |
| 2007/0040213 A1* | 2/2007 | Hotta et al. | ................. 257/330 |

FOREIGN PATENT DOCUMENTS

| JP | 10-214968 A | 8/1998 |
| JP | 10-256545 | 9/1998 |
| JP | 3367857 B2 | 11/2002 |
| JP | 2003-197910 A | 7/2003 |
| JP | 2003-318394 A | 11/2003 |

* cited by examiner

*Primary Examiner*—David Vu
*Assistant Examiner*—Brandon Fox
(74) *Attorney, Agent, or Firm*—McDermott Will & Emery LLP

(57) ABSTRACT

A semiconductor substrate is formed with trenches, and each of the trenches includes: a gate electrode portion in which a gate electrode is arranged; and a gate lead portion which is brought into contact with an interconnect for electrically connecting the gate electrode to the outside. In the gate lead portion for electrically connecting the gate electrode to the outside, an end of each of the trenches has a greater width than a portion of the trench other than the end.

4 Claims, 11 Drawing Sheets

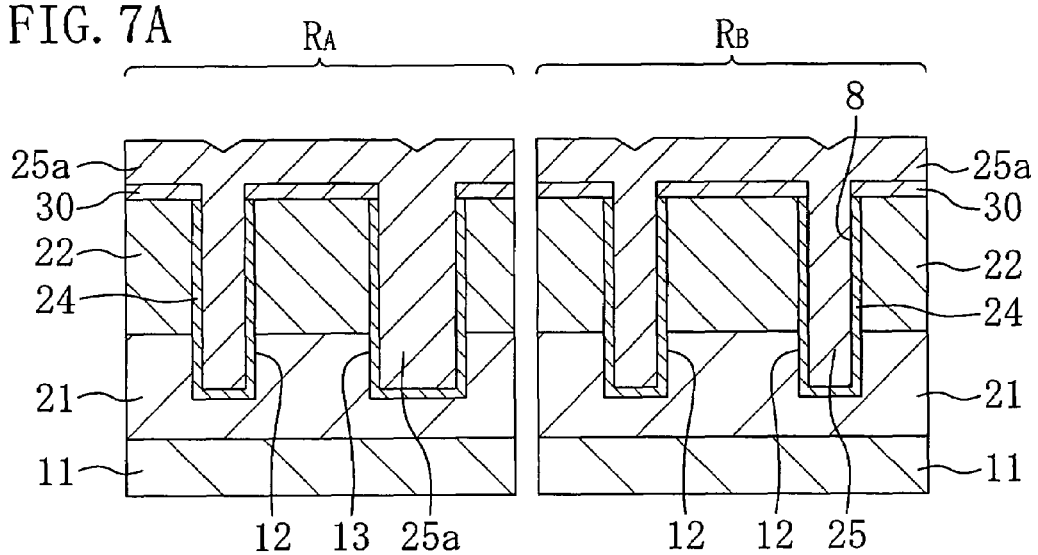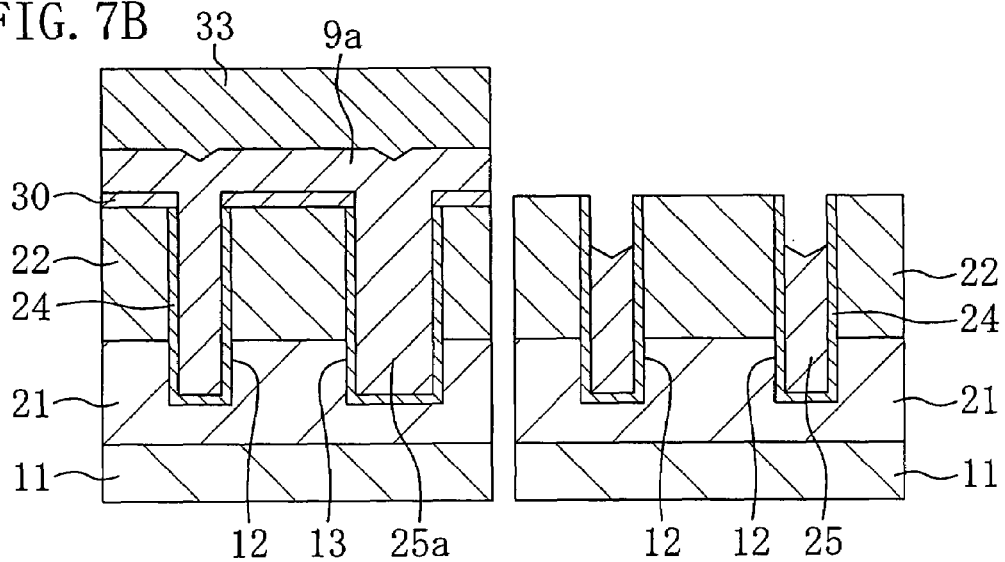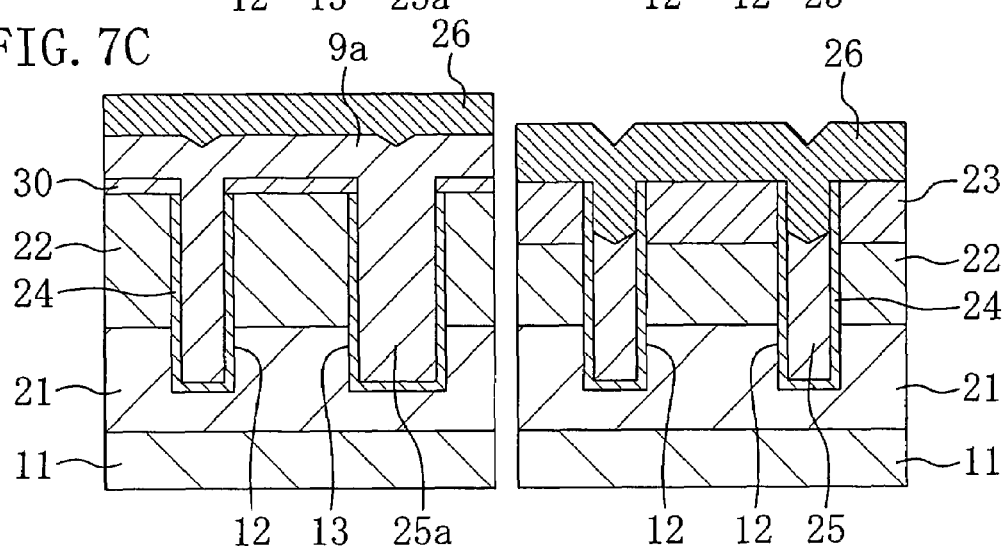

SEMICONDUCTOR DEVICE

RELATED APPLICATIONS

This application is the U.S. National Phase under 35 U.S.C. §371 of International Application No. PCT/JP2005/017963, filed on Sep. 29, 2005, which in turn claims the benefit of Japanese Application No. 2004-283888, filed on Sep. 29, 2004, the disclosures of which Applications are incorporated by reference herein.

TECHNICAL FIELD

The present invention relates to semiconductor devices with trench gates, and in particular to semiconductor devices with vertical gate electrodes.

BACKGROUND ART

In recent years, electronic equipment has attained lower power consumption, greater functionality, and higher speed. With this trend, semiconductor devices associated with the equipment have also been required to attain lower power consumption and higher speed. To meet this requirement, semiconductor devices generally used for load switches and DC-DC converters of electronic equipment are required to have transistors with smaller on-resistances.

One approach to decreasing the on-resistance of a transistor is that a device is miniaturized to increase the density of transistors arranged per unit area. Examples of this approach include a method for fabricating a vertical gate semiconductor device in which a trench is formed in a substrate and a gate insulating film and a gate electrode are formed inside the trench. The vertical gate semiconductor device can have an increased transistor density by arranging the trenches in a stripe pattern and making the width of each trench finer and also the pitch between the adjacent trenches smaller.

In the vertical gate semiconductor device, a gate lead portion (a gate connection portion) is provided in order to lead the gate electrode to the outside of the trench to bring the electrode into electric contact with an aluminum interconnect or the like. FIG. 12 is a plan view showing the structure of a conventional vertical gate semiconductor device. Referring to FIG. 12, in the conventional vertical gate semiconductor device, the semiconductor substrate 100 is provided with a plurality of trenches 101, and each of the trenches 101 is provided with a gate electrode portion 102 and a gate lead portion 103.

For the vertical gate semiconductor device thus constructed, thermal oxidation is typically conducted to form a gate insulating film on the inner wall of the trench. This thermal oxidation process, however, causes dislocations or defects significantly in a discontinuous portion of the trench, particularly in the gate lead portion located at the end of the trench. To solve such a problem, another approach is proposed in which a plurality of gate electrodes are connected to each other by their respective gate lead portions with gently varying curvatures (see Patent Document 1).

This approach will now be described. FIGS. 13(a) and 13(b) are a plan view and a sectional view showing the structure of a conventional vertical gate semiconductor device, respectively. Referring to FIG. 13(a), in the conventional vertical gate semiconductor device, an end 112 of a trench 111 is provided in a gate lead portion 113. The end 112 bifurcates, and the respective bifurcated portions are connected to ends 112 of adjacent trenches 111. As shown in FIG. 13(b), in the cross section of the end 112, an $n^-$-epitaxial layer 122 and a p-type base diffusion layer 123 are formed on an $n^+$-semiconductor substrate 121. The surface of the end of the trench 111 is formed with a gate insulating film 124 and a polysilicon film 125.

The structure as shown above is employed to eliminate the discontinuous portion of the trench. Therefore, in the thermal oxidation process, stress induced by the oxidation can be reduced.

Patent Document 1: Japanese Patent No. 3367857

DISCLOSURE OF INVENTION

Problems to be Solved by the Invention

The conventional technique disclosed in FIG. 12, however, causes not only the stress problem as described above but also a problem of an increase in leakage current.

In view of the foregoing, an object of the present invention is to provide a semiconductor device with a vertical gate structure capable of reducing leakage current by modifying the shape of a gate lead portion, and to provide its fabrication method.

Means for Solving the Problems

A first semiconductor device according to the present invention is a semiconductor device having gate insulating films and gate electrodes in a plurality of trenches, respectively, formed in a semiconductor substrate, and at least a portion of an end of each of the trenches has a greater width than a portion of each said trench other than the end.

With the first semiconductor device according to the present invention, at least a portion of the end of each of the trenches can have a greater width than the other portion thereof to suppress, in forming the trench by etching, concentration of etchant onto the end of the trench. Therefore, the end of the trench can be prevented from being etched at a high rate, so that the resulting phenomenon can be prevented in which the end of the trench is formed deeper than the other portion and finally into an additional fine trench (referred hereinafter to as a subtrench). Conventionally, when the surface of a trench formed with a subtrench is subjected to thermal oxidation, proceeding of the thermal oxidation becomes difficult at the end of the trench, which disadvantageously causes formation of a thinned gate insulating film. However, with the first semiconductor device of the present invention, such a disadvantage can be avoided. As a result of this, the occurrence of leakage current can be suppressed.

In the first semiconductor device according to the present invention, each of the trenches may include: a gate electrode portion in which the gate electrode is arranged; and a gate lead portion for electrically connecting the gate electrode to the outside, and the end may be an end located in the gate lead portion.

In the first semiconductor device according to the present invention, in the gate electrode portion, the trenches may be arranged in a stripe pattern.

In the first semiconductor device according to the present invention, in two adjacent trenches of the trenches, their ends may be arranged in different alignments across the direction in which the stripe pattern extends. With this device, even in the case where the pitch between the trenches is small, overlapping of the ends can be avoided.

In the first semiconductor device according to the present invention, in one of the trenches and two of the trenches adjacent thereto, the end of one said trench may be arranged in different alignment from the ends of the two trenches adjacent thereto across the direction in which the stripe pattern extends, and the ends of the two trenches adjacent thereto may be arranged in the same alignment across the direction in which the stripe pattern extends.

In the first semiconductor device according to the present invention, the semiconductor substrate may be formed with: a drain region; a body region located on the drain region; and a source region located on the body region, and the trenches may be formed so that they penetrate the source region and the body region to reach the halfway depth of the drain region.

In the first semiconductor device according to the present invention, the device may be a vertical, insulated-gate semiconductor device in which a current flows in the depth direction.

A second semiconductor device according to the present invention is a semiconductor device having gate insulating films and gate electrodes in a plurality of trenches, respectively, formed in a semiconductor substrate, and ends of the trenches are formed in a honeycomb pattern.

With the second semiconductor device according to the present invention, the ends of the trenches can be formed in a honeycomb pattern to suppress, in forming the trenches by etching, concentration of etchant onto the ends of the trenches. Therefore, the end of each of the trenches can be prevented from being etched at a high rate, so that the resulting phenomenon can be prevented in which the end of the trench is formed deeper than the other portion and finally into an additional fine trench (referred hereinafter to as a subtrench). Conventionally, when the surface of a trench formed with a subtrench is subjected to thermal oxidation, proceeding of the thermal oxidation becomes difficult at the end of the trench, which disadvantageously causes formation of a thinned gate insulating film. However, with the second semiconductor device of the present invention, such a disadvantage can be avoided. As a result of this, the occurrence of leakage current can be suppressed.

Moreover, with the second semiconductor device according to the present invention, in the step of thermally oxidizing the surface of the trench, the occurrence of stress induced by the oxidation can be prevented. This reduces the amount of stress caused in the trench itself, so that the amount of stress the interlayer insulating film deposited above the trench imposes on the gate electrode inside the trench can also be reduced. As a result, dislocations and defects occurring inside the semiconductor substrate can be suppressed to improve both of the yield and the reliability of the semiconductor device.

In the second semiconductor device according to the present invention, each of the trenches may include: a gate electrode portion in which the gate electrode is arranged; and a gate lead portion for electrically connecting the gate electrode to the outside, and the end may be an end located in the gate lead portion.

In the second semiconductor device according to the present invention, in the gate electrode portion, the trenches may be arranged in a stripe pattern.

In the second semiconductor device according to the present invention, each of the ends may be provided with two or more hexagons in the direction in which the stripe pattern extends.

In the second semiconductor device according to the present invention, the semiconductor substrate may be formed with: a drain region; a body region located on the drain region; and a source region located on the body region, and the trenches may be formed so that they penetrate the source region and the body region to reach the halfway depth of the drain region.

Technical Advantages

With the semiconductor device according to the present invention, the occurrence of a subtrench at the end of the trench can be prevented.

BRIEF DESCRIPTION OF THE DRAWINGS

FIGS. 7(a) to 7(c) are sectional views showing fabrication process steps of the semiconductor device according to the first embodiment of the present invention.

Figure 1A:
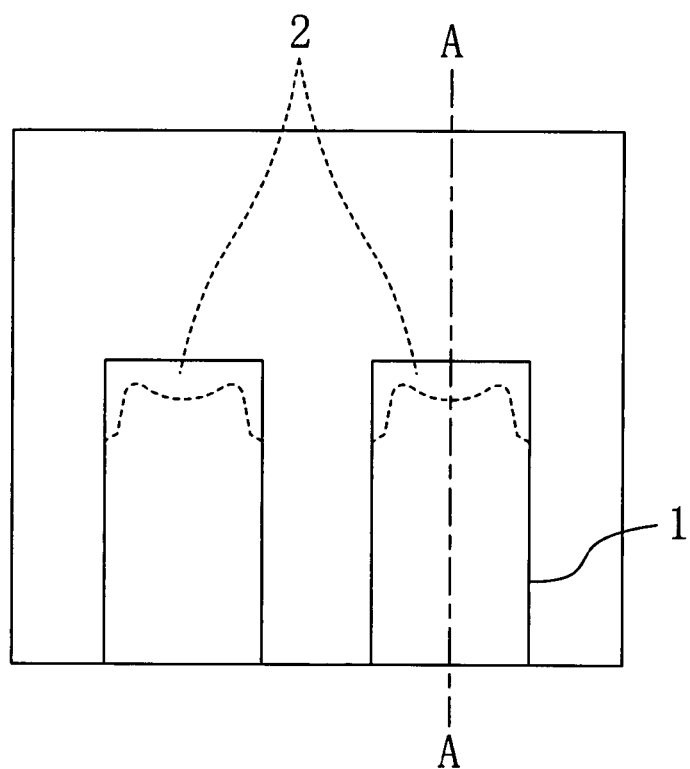
FIGS. 1(a) and 1(b) are enlarged views showing a gate lead portion of a conventional semiconductor device with a vertical gate structure.

EXPLANATION OF REFERENCES 1 trench
2 subtrench
11 semiconductor substrate
12 trench
13 end
21 epi-layer drain region
22 body region
23 source region
24 gate insulating film
25 gate electrode
25a polysilicon film
26 silicon oxide film
27 barrier metal
28 aluminum film
30 silicon oxide film
31 photoresist
32 silicon oxide film
33 photoresist
34 photoresist

BEST MODE FOR CARRYING OUT THE INVENTION (Consideration)

As described in the section "PROBLEMS TO BE SOLVED BY THE INVENTION", the conventional semiconductor device with the vertical gate structure has the problem of the occurrence of leakage current. The inventors found out the cause of this problem. The cause will now be described below.

Figure 1B:
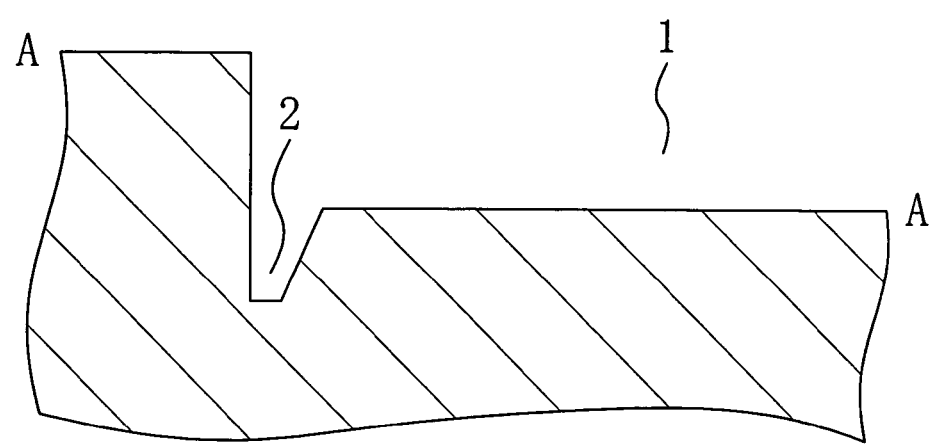

FIGS. 1(a) and 1(b) are enlarged views showing a gate lead portion of the conventional semiconductor device with the vertical gate structure.

Referring to FIGS. 1(a) and 1(b), it is found that when the width of a trench 1 decreases with device miniaturization, the end of the trench 1 is supplied with an excessive amount of etchant in the step of forming the trench 1. This probably arises from the phenomenon in which a greater amount of etchant having collided against the side wall of the trench is supplied to the end of the trench 1 than to the other portions. Excessive supply of etchant promotes faster etching of the excessively-supplied portion, so that the end of the trench 1 is formed with a fine subtrench 2 having a greater depth than the other portions.

If the surface of the trench in such a situation is subject to thermal oxidation to form a gate insulating film, proceeding of the thermal oxidation becomes difficult in the portion formed with the subtrench 2. As a result of this, the formed gate insulating film is thinned around that portion. This will probably cause an increase in gate leakage.

From the consideration mentioned above, in the present invention, the end of the trench 1 is designed to have a modified shape.

First Embodiment

A method for fabricating a semiconductor device according to a first embodiment of the present invention will be described below with reference to the accompanying drawings.

Figure 2:
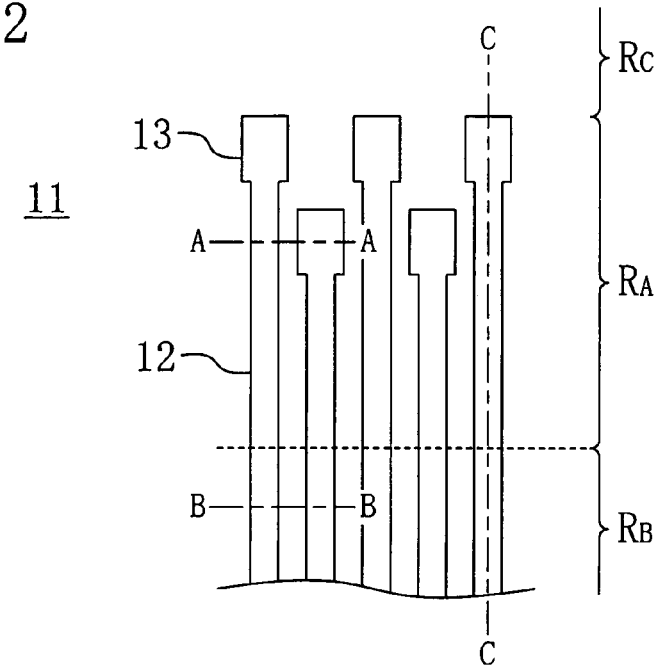
FIG. 2 is a plan view showing the structure of a semiconductor device according to a first embodiment of the present invention.

FIG. 2 is a plan view showing the structure of a trench according to the first embodiment of the present invention. Referring to FIG. 2, in the first embodiment, a plurality of trenches 12 are formed in the surface of a semiconductor substrate 11 made of silicon. Each of the trenches 12 is formed to contiguously have a gate electrode portion $R_B$ and a gate lead portion $R_A$ connected to the gate electrode portion $R_B$. An end 13 of each of the trenches 12 in the gate lead portion $R_A$ has a greater width than the other portion of the trench. The trenches 12 alternately having two types of lengths are provided in the gate lead portion $R_A$, and thus the ends 13 of the trenches 12 are arranged alternately. With this structure, even in the semiconductor device having the trenches 12 with small pitches, the respective ends 13 can be formed without overlapping the adjacent ends 13. The gate lead portion $R_A$ is adjacent to an interconnect portion $R_C$, and in the interconnect portion $R_C$, a gate electrode (shown in FIG. 3 and the like) is electrically connected to the outside.

Figure 3:
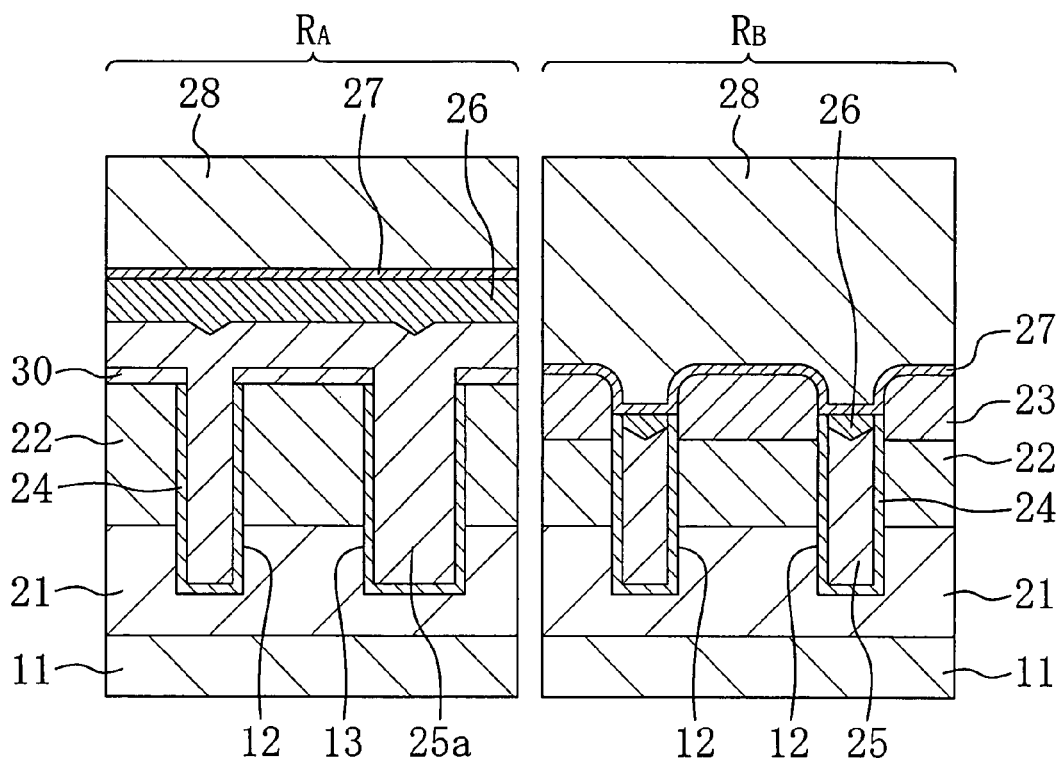
FIG. 3 is a sectional view of a gate lead portion taken along the line A-A in FIG. 2 and a sectional view of a transistor region taken along the line B-B therein.

FIG. 3 is a sectional view of the gate lead portion taken along the line A-A in FIG. 2 and a sectional view of the transistor region taken along the line B-B therein.

Referring to FIG. 3, in the transistor region $R_B$ in the semiconductor device of the first embodiment, in the semiconductor substrate 11, an epi-layer drain region 21 of a first conductivity type, a body region 22 of a second conductivity type, and a source region 23 are formed in this order from bottom to top. The semiconductor substrate 11 is formed with a plurality of trenches 12. Each of the trenches 12 penetrates the source region 23 and the body region 22 to reach the halfway depth of the epi-layer drain region 21. The top edge of the trench 12 is rounded. The surface of the trench 12 is formed with a gate insulating film 24, and the inside of the trench 12 is filled with a gate electrode 25 with the gate insulating film 24 interposed therebetween. A portion of the trench 12 located on the gate electrode 25 is formed with a silicon oxide film 26, and the top surface of the silicon oxide film 26 is covered with a barrier metal 27. The barrier metal 27 expands from the top of the silicon oxide film 26 inside the trench 12 onto the side wall of the trench 12, and also covers the top surface of the source region 23 outside the trench 12. The barrier metal 27 is covered with an aluminum film 28.

On the other hand, as shown in FIG. 3, in the gate lead portion $R_A$ in the semiconductor device of the first embodiment, in the upper portion of the semiconductor substrate 11, the epi-layer drain region 21 of the first conductivity type and the body region 22 of the second conductivity type are formed in this order from bottom to top. The gate lead portion $R_A$ is also provided with a plurality of trenches 12, and each of the trenches 12 penetrates the body region 22 to reach the halfway depth of the epi-layer drain region 21. The surface of the trench 12 is covered with the gate insulating film 24, and the inside of the trench 12 is filled with a polysilicon film 25a with the gate insulating film 24 interposed therebetween. The polysilicon film 25a expands to above the body region 22 outside the trench 12. The polysilicon film 25a is covered with the silicon oxide film 26. The silicon oxide film 26 is covered with the barrier metal 27, and the barrier metal 27 is covered with the aluminum film 28.

Figure 4:
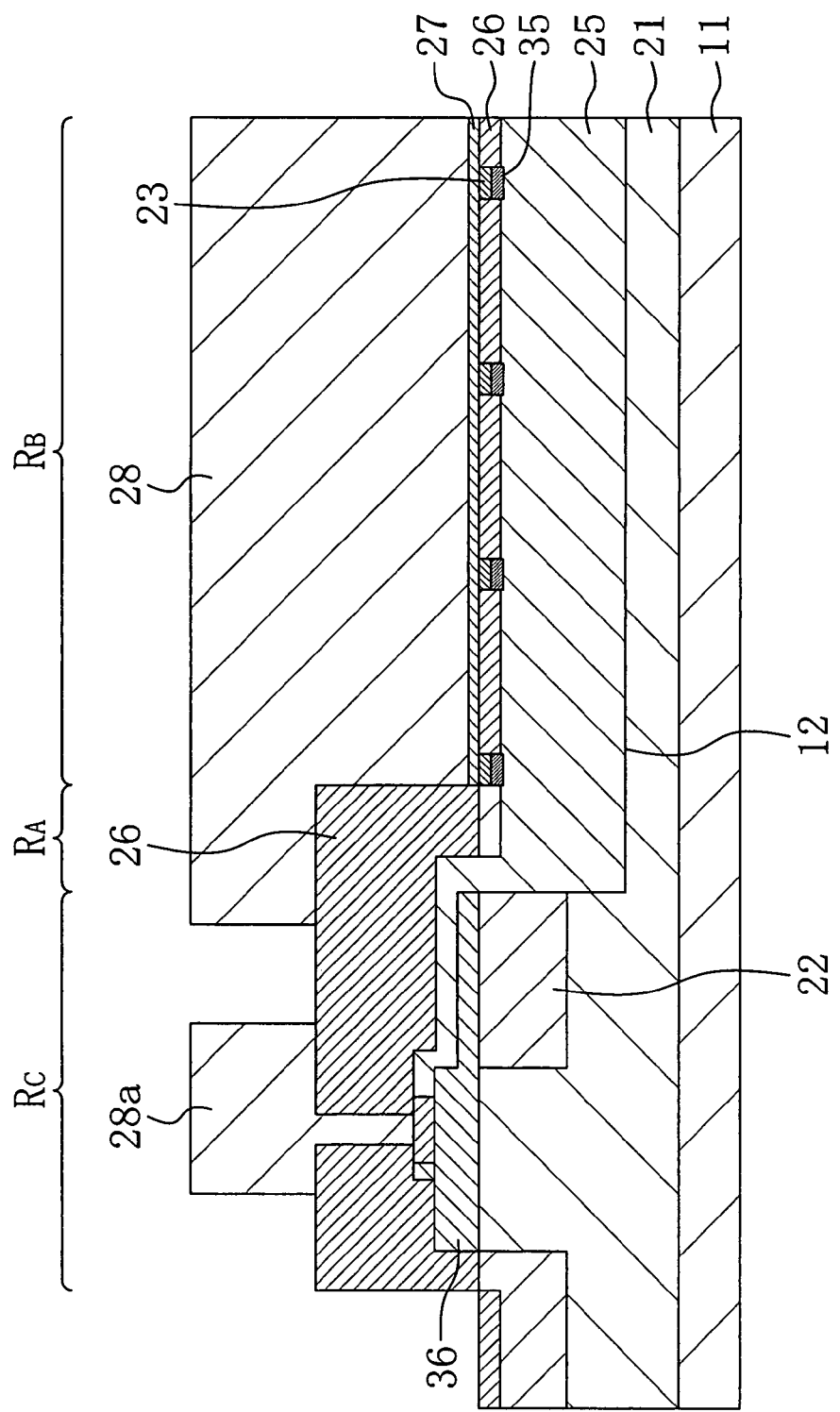
FIG. 4 is a view showing a cross section taken along the line C-C in FIG. 2.

FIG. 4 is a view showing the cross section taken along the line C-C in FIG. 2. Note that for the sake of clarity of this figure, illustration of some components is omitted in FIG. 4. Referring to FIG. 4, in the semiconductor device of the first embodiment, the gate electrode portion $R_B$, the gate lead portion $R_A$, and the interconnect portion $R_C$ located around the cell are disposed in this order. The polysilicon film 25a led to above the trench 12 (on an insulating film 36) in the gate lead portion $R_A$ extends to the interconnect portion $R_C$ around the cell, and therein comes into contact with an aluminum interconnect 28a. The aluminum interconnect 28a electrically connects the gate electrode 25a to the outside. As shown in FIG. 4, the silicon oxide film 26 located above the trench 12 is defined by a body contact region 35 and the source region 23 provided on the body contact region 35.

FIGS. 5(a) to 9(b) are sectional views showing fabrication process steps of the semiconductor device according to the first embodiment of the present invention. In the fabrication process of the semiconductor device according to the first embodiment, first, in the step shown in FIG. 5(a), the epi-layer drain region 21 of the first conductivity type is formed on the semiconductor substrate 11 of the first conductivity type. In the upper-layer portion of the epi-layer drain region 21, the body region 22 of the second conductivity type, which is the opposite conductivity type to the first conductivity type, is formed by ion implantation, and then thermal oxidation is conducted to form, on the surface of the body region 22, the silicon oxide film 30 having a thickness of 50 to 500 nm.

Figure 5A:
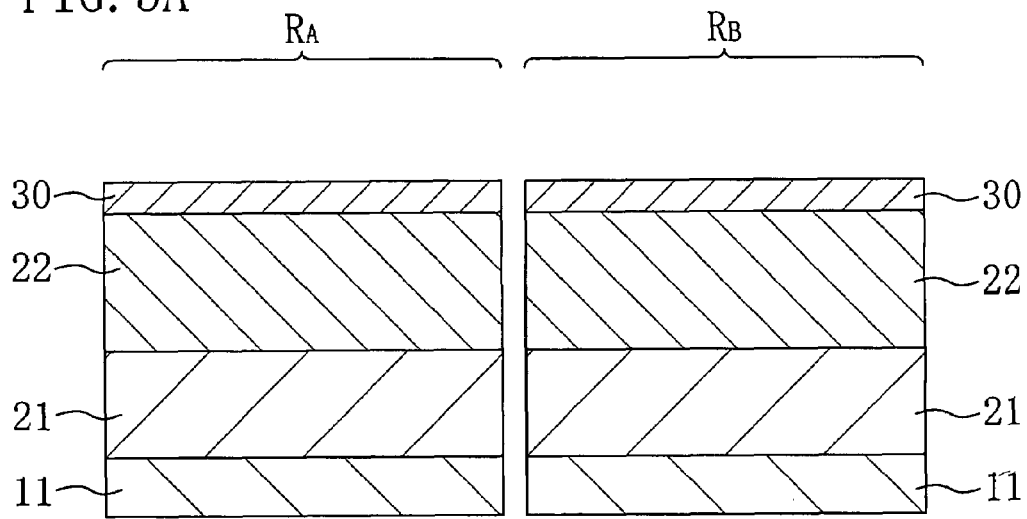
FIGS. 5(a) to 5(c) are sectional views showing fabrication process steps of the semiconductor device according to the first embodiment of the present invention.
Figure 5B:
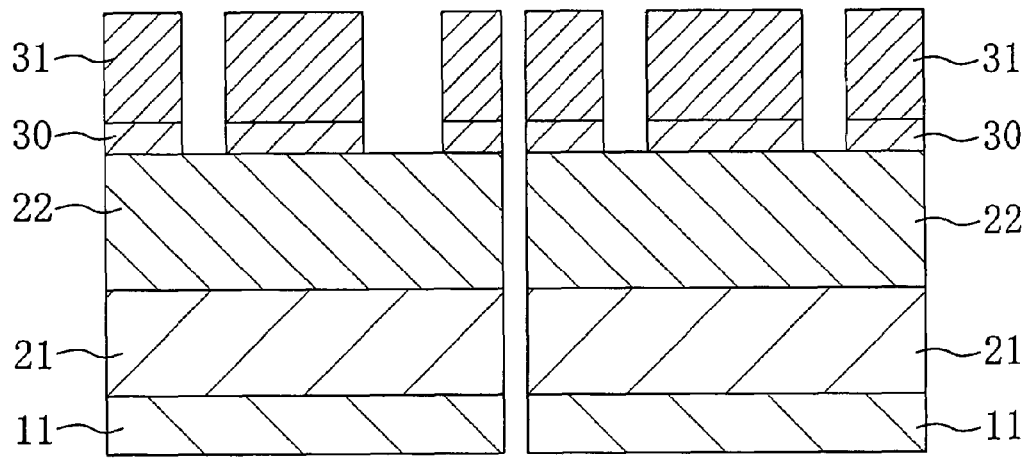

Next, in the step shown in FIG. 5(b), a photoresist 31 having openings above trench formation regions is formed on the silicon oxide film 30, and then the silicon oxide film 30 is etched.

Figure 5C:
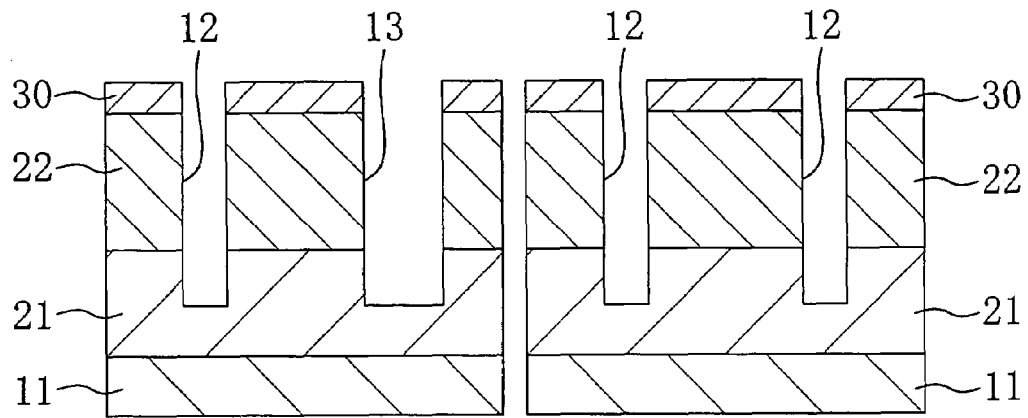

Subsequently, in the step shown in FIG. 5(c), dry etching is performed using the patterned silicon oxide film 30 as a mask to form the trenches 12 and their ends 13 in the semiconductor substrate 11. The trenches 12 have a depth of 0.8 to 3.0 μm, and penetrate the body region 22 of the second conductivity type to reach the epi-layer drain region 21 of the first conductivity type. As shown in FIG. 2, the trenches 12 are formed in a region expanding from the gate lead region $R_A$ to the transistor region $R_B$, and the end 13 of each of the trenches 12 provided in the gate lead region $R_A$ is formed to have a greater width than the other portion.

Figure 6A:
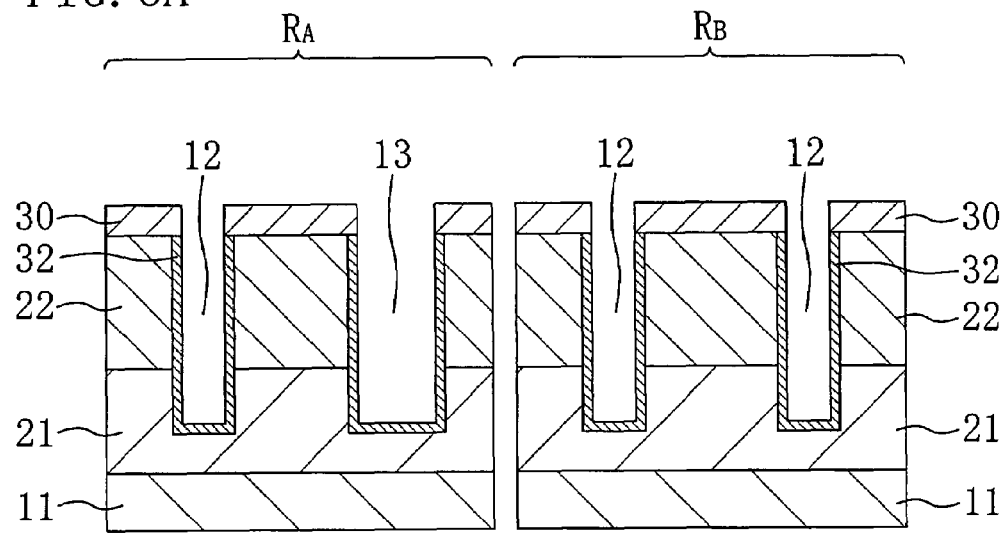
FIGS. 6(a) to 6(c) are sectional views showing fabrication process steps of the semiconductor device according to the first embodiment of the present invention.

In the step shown in FIG. 6(a), thermal oxidation for releasing damages created in the upper and bottom portions and the side wall of the trench 12 is conducted to form the silicon oxide film 32 having a thickness of 20 to 100 nm.

Figure 6B:
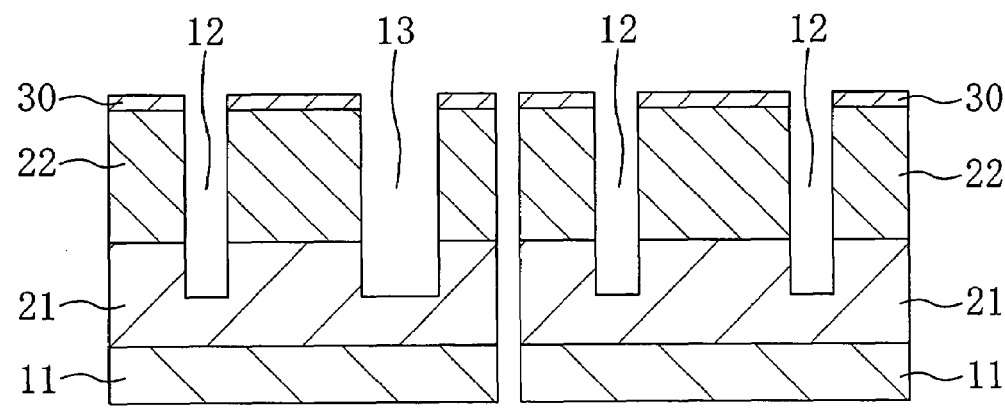

Next, in the step shown in FIG. 6(b), the silicon oxide films 30 and 32 having been formed are removed by wet etching. In this removal, a portion of the silicon oxide film 30 remains on the body region 22.

Figure 6C:
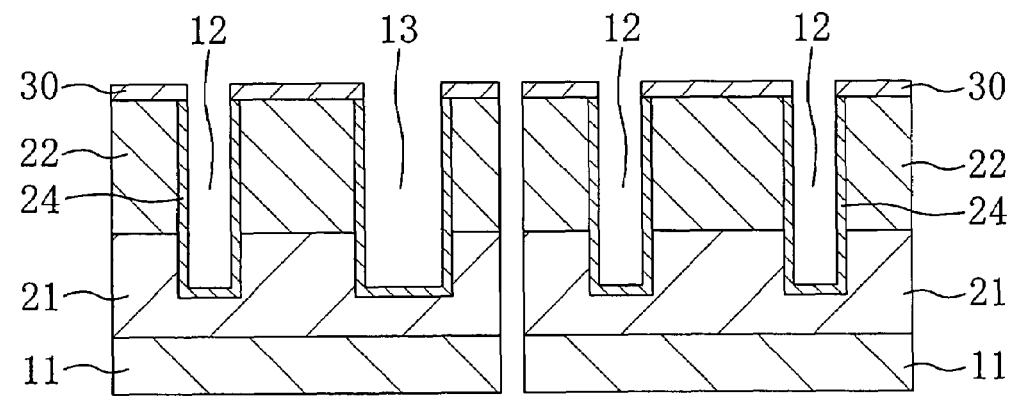

Subsequently, in the step shown in FIG. 6(c), thermal oxidation is conducted to form, on the surfaces of the trenches 12 and their ends 13, the gate insulating film 24 having a thickness of 8 to 100 nm.

In the step shown in FIG. 7(a), a polysilicon film 25a with a thickness of 200 to 800 nm is formed which fills the trenches 12 and their ends 13 and also covers the body region 22 located outside the trench 12.

Next, in the step shown in FIG. 7(b), a photoresist 33 having openings above the transistor region $R_B$ and covering the gate lead portion $R_A$ is formed on the polysilicon film 25a, and etching is performed using the photoresist 33 as an etching mask. This etching is performed until in the transistor region $R_B$, a portion of the polysilicon film 25a lying outside the trenches 12 is fully removed and portions of the polysilicon film 25a located inside the trenches 12 are set back to positions 200 to 800 nm below the top surface of the source region 23. Thus, the gate electrodes 25 filling the lower portions of the trenches 12 are formed in the transistor region $R_B$. During this etching, since in the gate lead portion $R_A$ and the interconnect portion $R_C$ (shown in FIG. 4) around the cell, the polysilicon film 25a is covered with the photoresist 33, the film remains without being etched.

Subsequently, in the step shown in FIG. 7(c), the silicon oxide film 26 with a thickness of 400 to 800 nm is formed which covers the gate lead portion $R_A$ and the transistor region $R_B$.

Figure 8A:
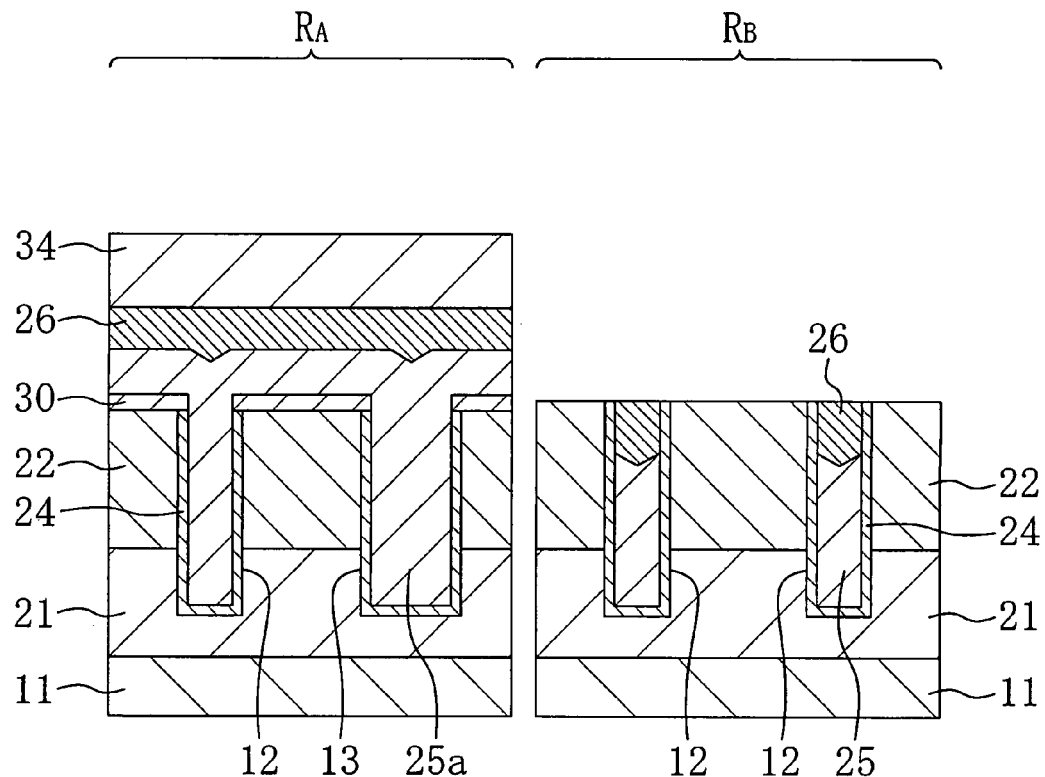
FIGS. 8(a) and 8(b) are sectional views showing fabrication process steps of the semiconductor device according to the first embodiment of the present invention.

In the step shown in FIG. 8(a), etch back is performed in the state in which a photoresist 34 covers the gate lead portion $R_A$ and the interconnect portion $R_C$ (shown in FIG. 4) around the cell and has an opening above the transistor region $R_B$. Thus, in the transistor region $R_B$, the silicon oxide film 26 is removed to have a surface flush with the surface of the body region 22, and concurrently the surface of the silicon oxide film 26 is planarized. As a result, inside the trenches 12 in the transistor region $R_B$, the spaces above the respective gate electrodes 25 are filled with the silicon oxide film 26. On the other hand, in the gate lead portion $R_A$, the silicon oxide film 26 remains and serves as an interlayer insulating film.

Figure 8B:
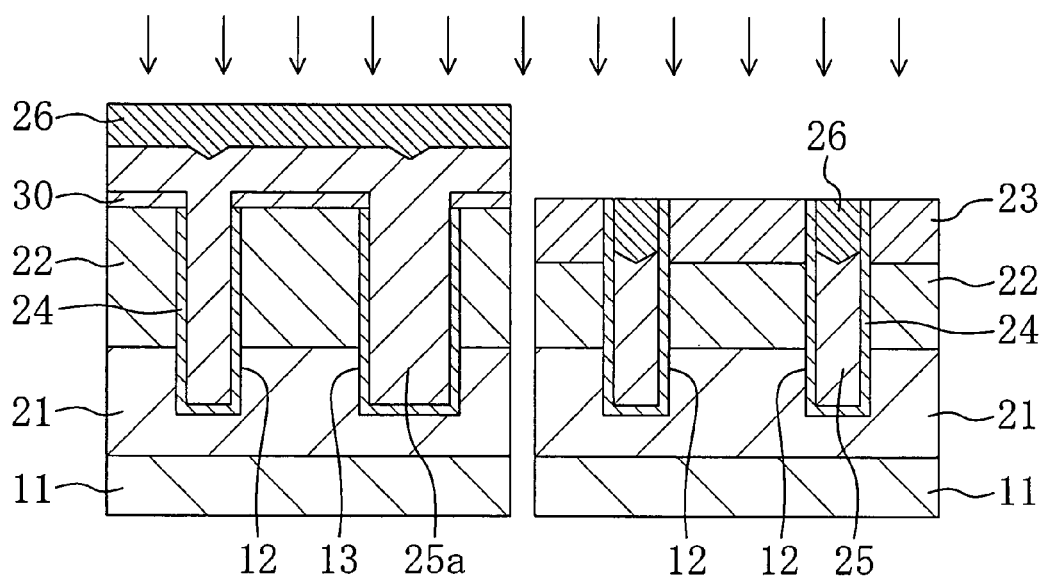

Next, in the step shown in FIG. 8(b), an impurity of the first conductivity type is implanted from above the substrate. Thus, in the transistor region $R_B$, the source region 23 is formed in the upper portion of the body region 22. On the other hand, in the gate lead region $R_A$, this procedure results in impurity implantation into the silicon oxide film 26.

Figure 9A:
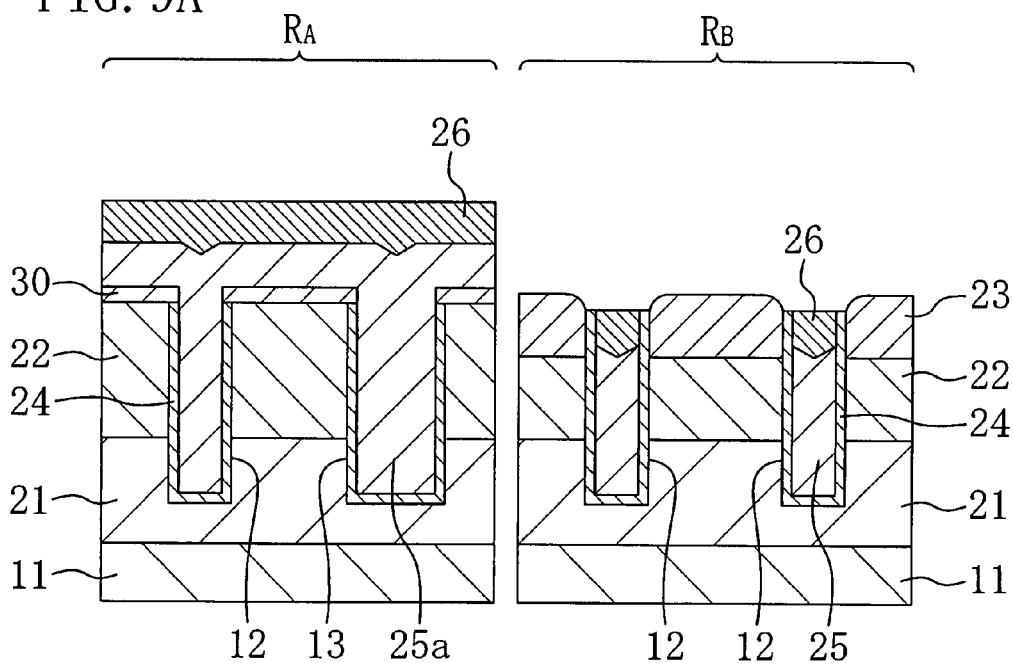
FIGS. 9(a) and 9(b) are sectional views showing fabrication process steps of the semiconductor device according to the first embodiment of the present invention.

Subsequently, in the step shown in FIG. 9(a), by dry etching of the entire surface of the transistor region $R_B$, the silicon oxide film 26 filling the trench 12 is removed to have a surface 100 to 300 nm deeper than the surface of the region. During this step, by performing the dry etching on the condition that the selectivity is higher with respect to the silicon oxide film than with respect to silicon, an edge of the source region 23 forming the upper end of the trench 12 can be rounded.

Figure 9B:
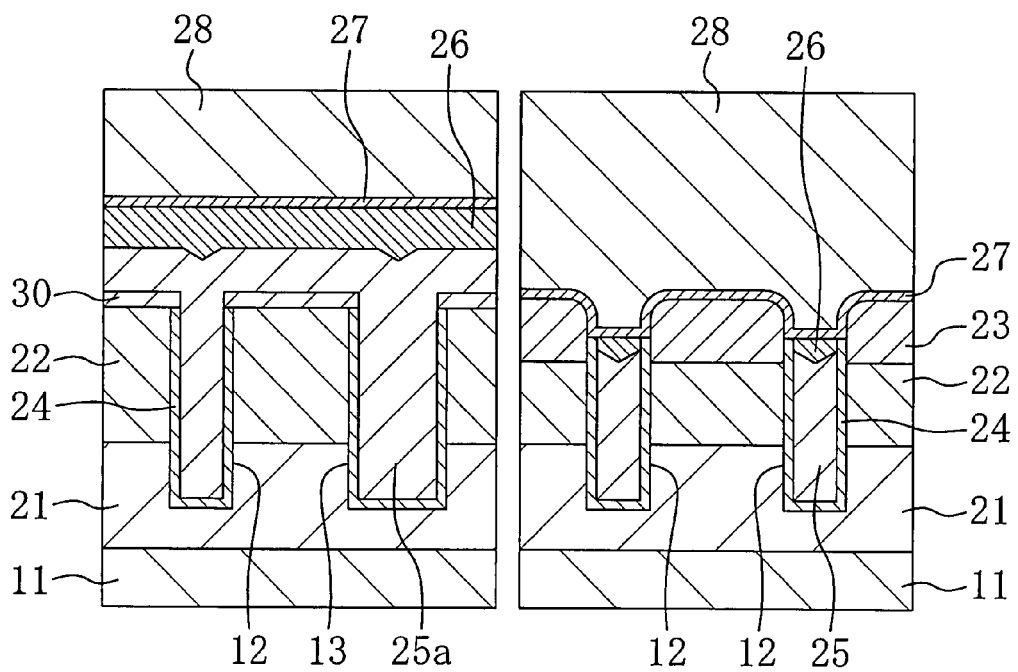

In the step shown in FIG. 9(b), the barrier metal 27 and the aluminum film 28 as interconnect materials are deposited over the gate lead portion $R_A$ and the transistor region $R_B$, and then patterning is conducted. With the steps shown above, the semiconductor device of the first embodiment can be fabricated.

In the above description, by arranging the ends of the trenches 12 alternately in the gate lead portion $R_A$, the pitch between the trenches 12 can be decreased. However, the arrangement of the ends of the trenches 12 is not limited to this, and irregular arrangement or horizontal alignment may be employed.

Note that FIG. 2 illustrates the case where the end 13 of each of the trenches 12 has a rectangular plan shape (a hammerhead-like shape). However, in the first embodiment, it is sufficient that the end 13 of the trench 12 has a greater width than the other portion thereof. Therefore, the end 13 may have the shape of, for example, a circle, a quadrangle, or a polygon other than a quadrangle. The width of the end 13 does not necessarily have to be uniform, and the end 13 may have an alternative shape in which one part thereof is wider and the other part thereof is narrower than the portion of the trench other than the end 13.

With the semiconductor device of the first embodiment, the end 13 of each of the trenches 12 can have a greater width than the other portion thereof to suppress, in forming the trench 12 by etching, concentration of etchant onto the end 13 of the trench 12. Therefore, the end 13 of the trench 12 can be prevented from being etched at a high rate, so that the resulting phenomenon can be prevented in which the end 13 of the trench 12 is formed deeper than the other portion and finally into a subtrench. Conventionally, when the surface of a trench formed with a subtrench is subjected to thermal oxidation, proceeding of the thermal oxidation becomes difficult at the end of the trench, which disadvantageously causes formation of a thinned gate insulating film. However, with the first semiconductor device of the present invention, such a disadvantage can be avoided. As a result of this, the occurrence of leakage current can be suppressed.

Moreover, with the semiconductor device of the first embodiment, the ends 13 of the trenches 12 are arranged alternately. With this arrangement, even in the semiconductor device having the trenches 12 with a smaller pitch, the ends 13 can be formed without overlapping the adjacent ends 13.

Second Embodiment

Figure 10:
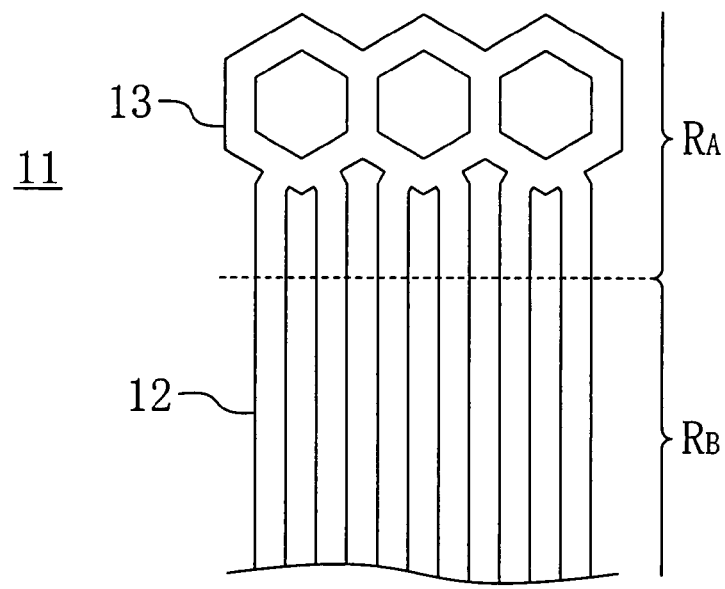
FIG. 10 is a plan view showing the structure of a semiconductor device according to a second embodiment of the present invention.

FIG. 10 is a plan view showing the structure of a semiconductor device according to a second embodiment of the present invention. Referring to FIG. 9, in the semiconductor device of the second embodiment, the ends of the trenches 12 are formed in a honeycomb pattern in the gate lead portion $R_A$. To be more specific, two trenches 12 extending from the transistor region $R_B$ to the gate lead region $R_A$ are connected in the gate lead portion $R_A$ to one hexagonal trench 12. In the gate lead portion $R_A$, adjacent hexagonal trenches 12 share one side, and thereby multiple hexagons are contiguously arranged to construct the honeycomb pattern. Although FIG. 10 illustrates the honeycomb pattern made by horizontally aligning the hexagons, multiple vertical lows of additional hexagons may also be arranged. Note that the wording "the trenches 12 are arranged in a honeycomb pattern" refers to the pattern in which the trenches with hexagonal plan shapes are arranged so that one hexagon shares at least one side thereof with another hexagon.

Note that a fabrication method of the semiconductor device according to the second embodiment is conducted in the same manner as the method described in the first embodiment except that the ends of the trenches 12 are formed in a honeycomb pattern. Hence, its description will be omitted.

With the semiconductor device of the second embodiment, the ends 13 of the trenches 12 can be formed in a honeycomb pattern to suppress, in forming the trenches 12 by etching, concentration of etchant onto the ends 13 of the trenches 12. Therefore, the end 13 of each of the trenches 12 can be prevented from being etched at a high rate, so that the resulting phenomenon can be prevented in which the end 13 of the trench 12 is formed deeper than the other portion and finally into a subtrench. Conventionally, when the surface of a trench formed with a subtrench is subjected to thermal oxidation, proceeding of the thermal oxidation becomes difficult at the end of the trench, which disadvantageously causes formation of a thinned gate insulating film. However, with the second semiconductor device of the present invention, such a disadvantage can be avoided. As a result of this, the occurrence of leakage current can be suppressed.

Moreover, with the semiconductor device according to the second embodiment, in the step of thermally oxidizing the surface of the trench 12, the occurrence of stress induced by the oxidation can be prevented. This reduces the amount of stress caused in the trench 12 itself, so that the amount of stress the interlayer insulating film deposited above the trench 12 imposes on the gate electrode inside the trench 12 can also be reduced. As a result, dislocations and defects occurring in silicon inside the semiconductor substrate 11 can be suppressed to improve both of the yield and the reliability of the semiconductor device.

Third Embodiment

Figure 11:
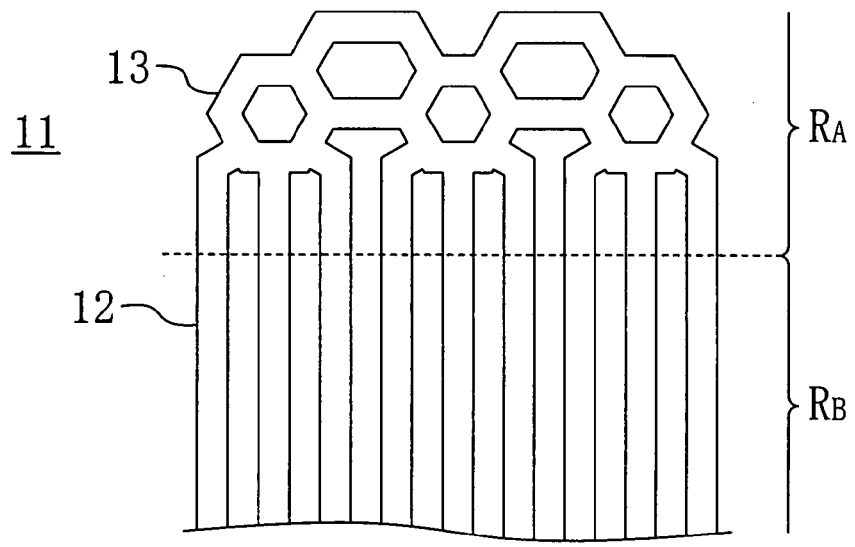
FIG. 11 is a plan view showing the structure of a semiconductor device according to a third embodiment of the present invention.
Figure 12:
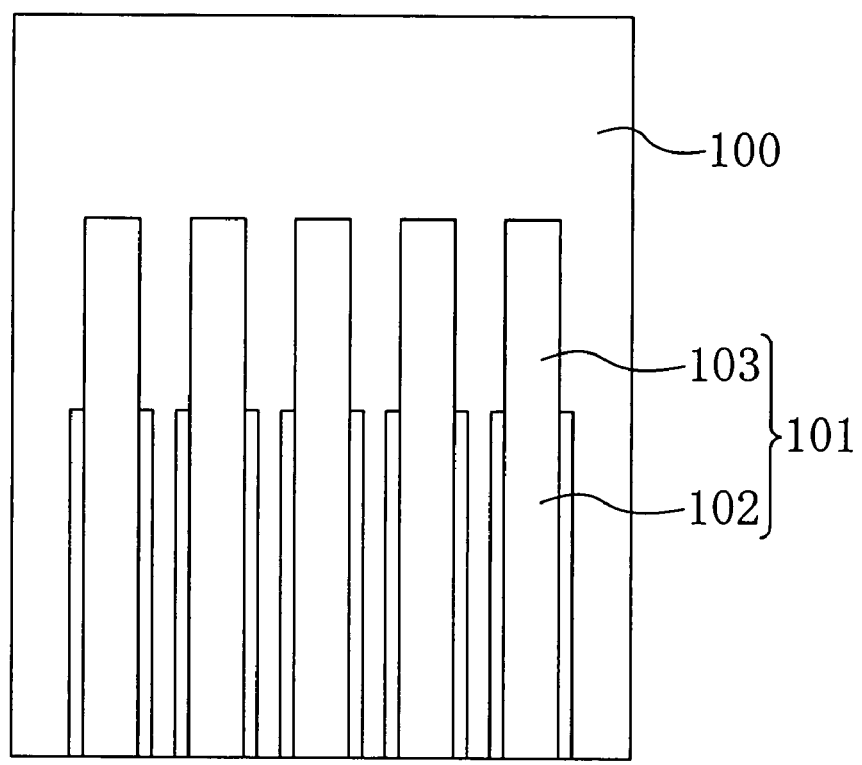
FIG. 12 is a plan view showing the structure of a conventional vertical gate semiconductor device.
Figure 13A:
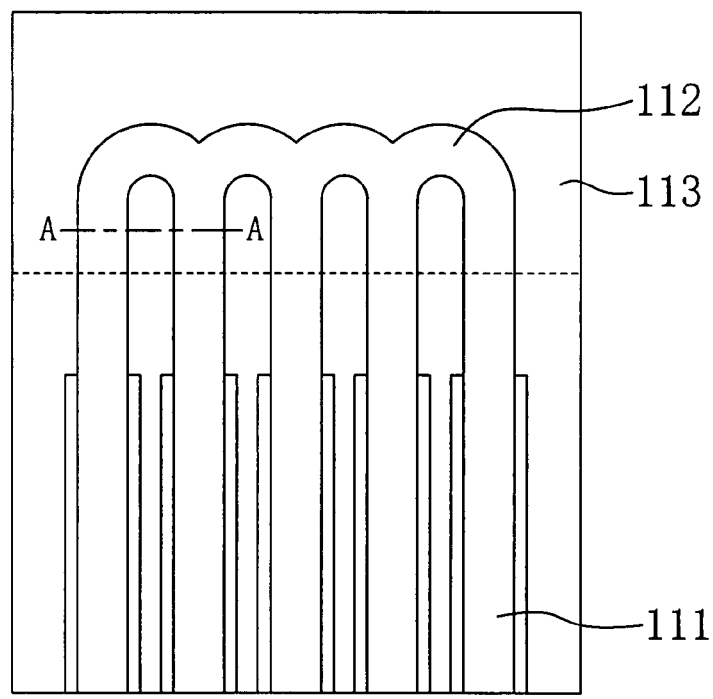
FIGS. 13(a) and 13(b) are a plan view and a sectional view showing the structure of a conventional vertical gate semiconductor device, respectively.
Figure 13B:
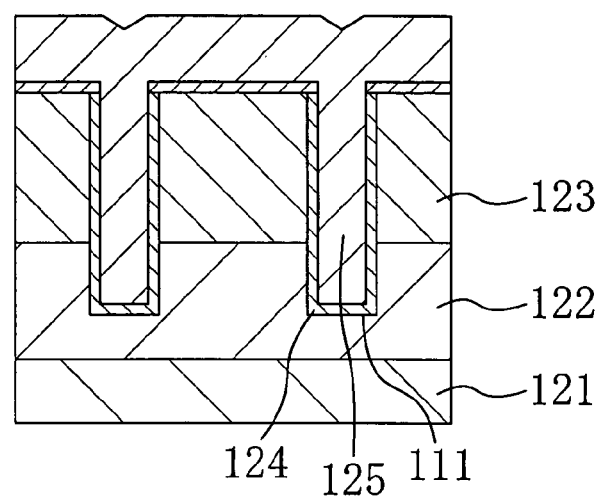

FIG. 11 is a plan view showing the structure of a semiconductor device according to a third embodiment of the present invention. Referring to FIG. 11, in the semiconductor device of the third embodiment, the trench ends in the second embodiment are disposed horizontally so that the direction of hexagon arrangement is rotated 30 degrees. The other structure thereof is identical to the device of the second embodiment, so that its detailed description will be omitted. In addition, the effects exerted by the structure of the third embodiment are also identical to the device of the second embodiment, so that its description will be omitted.

INDUSTRIAL APPLICABILITY

The semiconductor device according to the present invention can be used as a semiconductor device such as a MISFET or an IGBT which has a trench MIS gate structure with a high breakdown voltage for use in small-signal applications, power applications, or the like.

What is claimed is:

1. A semiconductor device having gate insulating films and gate electrodes in a plurality of trenches, respectively, formed in a semiconductor substrate,
    wherein at least a portion of an end of each of the trenches has a greater width than a portion of each said trench other than the end,
    each of the trenches comprises: a gate electrode portion in which the gate electrode is arranged; and a gate lead portion for electrically connecting the gate electrode to the outside,
    the end is an end located in the gate lead portion,
    in the gate electrode portion, the trenches are arranged in a stripe pattern, and
    in two adjacent trenches of the trenches, their ends are arranged in different alignments across the direction in which the stripe pattern extends.

2. The device of claim 1, wherein in one of the trenches and two of the trenches adjacent thereto, the end of one said trench is arranged in different alignment from the ends of the two trenches adjacent thereto across the direction in which the stripe pattern extends, and the ends of the two trenches adjacent thereto are arranged in the same alignment across the direction in which the stripe pattern extends.

3. The device of claim 1,
    wherein the semiconductor substrate is formed with: a drain region; a body region located on the drain region; and a source region located on the body region, and
    the trenches are formed so that they penetrate the source region and the body region to reach the halfway depth of the drain region.

4. The device of claim 1, wherein the device is a vertical, insulated-gate semiconductor device in which a current flows in the depth direction.

* * * * *